(12) United States Patent
Hinterberger et al.

(10) Patent No.: US 10,236,539 B2
(45) Date of Patent: Mar. 19, 2019

(54) BATTERY CELL FOR A BATTERY OF A MOTOR VEHICLE, BATTERY, AND MOTOR VEHICLE

(71) Applicant: AUDI AG, Ingolstadt (DE)

(72) Inventors: Michael Hinterberger, Großmehring (DE); Berthold Hellenthal, Schwanstetten (DE)

(73) Assignee: AUDI AG, Ingolstadt (DE)

( * ) Notice: Subject to any disclaimer, the term of this patent is extended or adjusted under 35 U.S.C. 154(b) by 86 days.

(21) Appl. No.: 15/551,186

(22) PCT Filed: Feb. 12, 2016

(86) PCT No.: PCT/EP2016/053072
§ 371 (c)(1),
(2) Date: Aug. 15, 2017

(87) PCT Pub. No.: WO2016/131731
PCT Pub. Date: Aug. 25, 2016

(65) Prior Publication Data
US 2018/0048030 A1    Feb. 15, 2018

(30) Foreign Application Priority Data
Feb. 18, 2015 (DE) .................. 10 2015 002 076

(51) Int. Cl.
*H01M 10/42* (2006.01)
*G01R 31/36* (2019.01)
(Continued)

(52) U.S. Cl.
CPC ...... *H01M 10/425* (2013.01); *G01R 31/3658* (2013.01); *G01R 31/44* (2013.01);
(Continued)

(58) Field of Classification Search
None
See application file for complete search history.

(56) References Cited

U.S. PATENT DOCUMENTS

2006/0152190 A1   7/2006   Riemschneider
2008/0001577 A1   1/2008   Sather
(Continued)

FOREIGN PATENT DOCUMENTS

DE    10 2010 011 740 A1    9/2011
DE    10 2011 016 373 A1   10/2012
(Continued)

OTHER PUBLICATIONS

Korean Office Action dated Oct. 10, 2018, in connection with corresponding KR Application No. 10-2017-7025658 (12 pgs., including machine-generated English translation).
(Continued)

*Primary Examiner* — Scott J. Chmielecki
(74) *Attorney, Agent, or Firm* — Maier & Maier, PLLC

(57) ABSTRACT

A battery cell for a battery of a motor vehicle having a galvanic element, a battery cell housing for accommodating the galvanic element, and at least two microelectronic circuits for monitoring the battery cell, wherein a first microelectronic circuit of the at least two microelectronic circuits is attached to a first carrier and a second microelectronic circuit of the at least two microelectronic circuits is attached to a second carrier, wherein the two carriers are arranged on top of one another and thus form a stack such that a top side of the first carrier is facing toward a bottom side of the second carrier. Embodiments of the invention further relates to a battery and a motor vehicle.

8 Claims, 4 Drawing Sheets

(51) Int. Cl.
*H01M 10/48* (2006.01)
*G01R 31/44* (2006.01)

(52) U.S. Cl.
CPC ....... *H01M 10/4257* (2013.01); *H01M 10/48* (2013.01); *H01M 2010/4271* (2013.01); *H01M 2200/00* (2013.01); *H01M 2220/20* (2013.01)

(56) References Cited

U.S. PATENT DOCUMENTS

| | | | |
|---|---|---|---|
| 2013/0149578 A1 | 6/2013 | Uchida | |
| 2013/0295419 A1* | 11/2013 | Kwon | G01R 31/36 429/10 |
| 2014/0184165 A1 | 7/2014 | Takahashi et al. | |
| 2015/0042283 A1* | 2/2015 | Camp | H02J 7/0019 320/121 |
| 2016/0164146 A1* | 6/2016 | Na | H01M 2/0469 429/7 |
| 2017/0018816 A1* | 1/2017 | Na | H01M 2/34 |

FOREIGN PATENT DOCUMENTS

| | | |
|---|---|---|
| DE | 10 2012 203 444 A1 | 9/2013 |
| JP | 2006-506787 | 2/2006 |
| KR | 10-2013-0023073 A | 3/2013 |
| WO | 2004/047215 A1 | 6/2004 |
| WO | 2012/034045 A1 | 3/2012 |
| WO | 2012/062574 A1 | 5/2012 |
| WO | 2013/143755 A1 | 10/2013 |

OTHER PUBLICATIONS

Notification of Transmittal of Translation of the International Preliminary Report on Patentability dated Aug. 31, 2017, in connection with corresponding international application No. PCT/EP2016/053072 (8 pages).

Examination Report dated Nov. 26, 2015 of corresponding German application No. 10 2015 002 076.5; 4 pgs.

International Search Report dated May 25, 2016 of corresponding International application No. PCT/EP2016/053072; 15 pgs.

* cited by examiner

BATTERY CELL FOR A BATTERY OF A MOTOR VEHICLE, BATTERY, AND MOTOR VEHICLE

FIELD

The invention relates to a battery cell for a battery of a motor vehicle having a galvanic element, a battery cell housing for accommodating the galvanic element, and at least two microelectronic circuits for monitoring the battery cell. The invention further relates to a battery as well as to a motor vehicle.

BACKGROUND

With known battery cells, a galvanic element is typically arranged in a battery cell housing. In order to provide a certain voltage or a certain current, a plurality of battery cells can be connected to form a battery. These batteries are currently used particularly as traction batteries in motor vehicles, for example in electric or hybrid vehicles, in order to drive the motor vehicles. When the batteries are used in motor vehicles, they must, however, fulfill certain requirements. Because traction batteries can provide a few hundred volts, special safety measures must be met in order to prevent, for example, an endangering of persons. In addition, high availability of the battery must be ensured. This availability particularly depends on the degree of damage or aging of the battery. Because the battery cells have fluctuations in their capacity and in their internal resistance caused during production, they are typically charged and discharged at different rates. This may result in damage to the battery when individual cells, for example, are completely discharged or overcharged.

In order to monitor a battery or individual battery cells, measures are known from the prior art. Thus, DE 10 2010 011 740 A1 indicates a battery, in which a state of individual battery cells is recorded by sensors and sent wirelessly to a prioritized central unit. WO 2012/034045 A1 describes a battery monitoring system in which a measuring device is attached on or in a battery cell. In addition, WO 2004/047215 A1 discloses a battery management system in which physical properties of same are monitored to extend the service life of the battery.

Because, however, only a limited structural or packaging space is available in motor vehicles, the integration of the batteries as well as the electronic systems thereof in the motor vehicle represents an extensive challenge.

The object of the present invention is to integrate microelectronic circuits for monitoring a battery cell so as to save space to the extent possible in order to minimize space requirements of the battery cell.

SUMMARY OF THE DISCLOSURE

This object is achieved according to the invention by means of a battery cell, a battery, as well as a motor vehicle having the features according to the independent claims. Advantageous embodiments of the invention are the subject matter of the dependent claims, the description, and the figures.

The battery cell according to the invention for a battery of a motor vehicle comprises a galvanic element, a battery cell housing for accommodating the galvanic element, and at least two microelectronic circuits for monitoring the battery cell. Furthermore, a first of the at least two microelectronic circuits is attached to a first carrier and a second of the at least two microelectronic circuits is attached to a second carrier. In doing so, the two carriers are arranged above one another and thus form a stack such that a top side of the first carrier is facing toward a bottom side of the second carrier.

The galvanic element is especially designed as a secondary cell, which can be discharged in order to supply an electric component and can be recharged again after being discharged The galvanic element here comprises two electrodes and an electrolyte, in a known manner. The galvanic element is arranged in the battery cell housing, which is produced, for example, from aluminum. In this process, the galvanic element may be electrically isolated with respect to the battery cell housing. To this end, an insulating material, for example, may be arranged between an inner side of a wall of the battery cell housing and the galvanic element. In order to supply an electronic component with electric voltage provided by the battery cell and/or to connect the battery cell to another battery cell, the battery cell housing in this case has two particularly exposed battery poles or battery connection terminals, in which each battery pole is electrically connected to a particular electrode of the galvanic element.

In order to monitor the battery cell, the battery cell has the at least two microelectronic circuits. The battery cell equipped with microelectronic circuits can also be characterized as an intelligent battery cell. Each of the microelectronic circuits here may comprise at least one so-called One-Chip-System or SoC (System-On-a-Chip). With such a One-Chip-System, various functions of a system, for example in the form of an integrated circuit (IC), are integrated or combined or programmed onto a common chip or semiconductor substrate. The system and/or the integrated circuit may comprise various elements and/or components, for example semiconductor elements, logic circuits, clocks, active and passive structural elements, sensors or FPGAs (Field Programmable Gate Arrays), which provide a certain functionality when connected together. In this design, a plurality of integrated circuits and/or one-chip systems are electrically connected to one another by way of printed circuit boards of the microelectronic circuit.

According to the invention, each of the microelectronic circuits is now arranged on a separate carrier. The carriers may be configured, for example, as printed circuit boards. The printed circuit boards in this case may be populated on one side or on both sides with chips and the printed circuit boards of the respective microelectronic circuit. For example, the printed circuit boards may be designed as flexible printed circuit boards, so-called PCB films. PCB films have a particularly low weight and an especially low thickness with simultaneously high mechanical flexural resilience as well as high temperature resistance. It may also be provided, however, that the printed circuit boards are designed as so-called Molded Interconnect Devices (MIDs). Such carriers are typically molded plastic components, to which metallic printed circuit boards are attached according to special methods. In doing so, the plastic components may be designed particularly as three-dimensional or plastic components. Thus, a carrier designed as an MID is especially flexible.

These separate carriers are stacked on top of one another so that a layered structure is formed. The first carrier is arranged under the second carrier here such that the top side of the first carrier is facing toward the bottom side of the second carrier. In doing so, the top side of the first carrier and the bottom side of the second carrier overlap one another at least in sections. Through this layered structure, the carriers, and the microelectronic circuits with them, can be arranged in the battery cell in an especially space-saving manner. In addition, the chips on the two printed circuit boards can be electrically contacted by means of especially short cable routes. In an advantageous manner, the microelectronic circuits can be supplied with electrical energy by the galvanic element itself. Thus, an autonomous system is formed.

According to an embodiment of the invention, the first microelectronic circuit is arranged in a first housing and the second microelectronic circuit is arranged in a second housing. The two encased or packaged microelectronic circuits here are placed on the respective carrier, whereby the two carriers are electrically and/or mechanically connected to one another.

A carrier with an electronic circuit, which is arranged in a housing, is characterized also as a package. The stack that results from the arrangement of two or more packages on top of one another is also characterized as a Package-on-Package (PoP).

The packages here i.e., the carriers with the encased microelectronic circuits located thereupon, can also be produced separately and independently from one another. Thus, the production of the packages can be transferred, for example, to various manufacturers with their particular expertise. The individual packages can then be combined to form the stack, i.e. the package-on-package, in a manner that is particularly flexible and specific to the requirements. In other words, this means that a functionality of the stack can be defined and flexibly provided by combining the corresponding packages. To effect the electrical and mechanical connection, the packages, particularly the carriers, can be soldered together. In addition, in the event of a defect in a package or a chip of the microelectronic circuit of a package, the particular package can be replaced in a particularly simple manner. Furthermore, the packages can be individually tested and replaced as needed in the event of a defect in an advantageous manner due to the modular production of the package.

According to another embodiment of the invention, the first carrier and the second carrier are arranged together in one housing. In addition, the two carriers within the common housing are mechanically and/or electrically connected to one another. The arrangement of the carriers in a common housing is also characterized as a System-in-Package (SiP). In order to supply the individual microelectronic circuits and/or for signal exchange with another respective microelectronic circuit or with a component outside of the stack, electrical contact surfaces, which are electrically connected to the individual carriers, for example, by means of bond wires, may be provided, for example in a surface of the common housing. Due to the integration of all microelectronic circuits in one housing, the stack can be designed in a particularly space-saving manner and thus arranged, for example, in an especially small cavity within the battery cell housing.

It may be provided that the housing or housings is or are produced from a material that is not sensitive to an electrolyte of the galvanic element, particularly to a ceramic material. When the stack is arranged within the battery cell, the housings must not disintegrate or become corroded due to, for example, the liquid substances, electrolyte, or other chemical substances. For example, corrosion can modify the chemical composition of the electrolyte and consequently a characteristic of the battery cell, particularly of the galvanic element. In addition, in the event of destruction of the housing, the chemical substances may come into contact with the microelectronic circuits and thereby cause destruction of said circuits. In order to prevent this, the housings are preferably produced from ceramic materials and/or special plastics or similar corrosion-resistant materials. Thus, protection of the microelectronic circuits can be provided in a reliable manner.

Especially preferably, at least one sensor element and/or at least one storage or memory element and/or at least one communication device and/or at least one microprocessor are provided as the elements of the microelectronic circuit. The at least one sensor element serves to record a physical and/or chemical property of the battery cell. Such a physical and/or chemical property may be, for example, a temperature within the battery cell housing, a pressure within the battery cell housing, an acceleration of the battery cell, or a chemical composition of the electrolyte of the galvanic element.

The data recorded by the at least one sensor element may be stored on the at least one storage element. Thus, a state of the battery cell may be monitored over an entire operating period or service life of the battery cell. The at least one microprocessor may be designed, for example, to evaluate the data recorded by the sensor element and/or the data stored in the storage element in order to record, for example, a change in a physical and/or chemical property over an operating period of the battery cell. The at least one communication device may be designed, for example, to communicate with components inside and outside of the battery cell. A component outside of the battery cell may be, for example, a battery management system of the motor vehicle or another battery cell. A component inside the cell may be, for example, an element on the other carrier or also a sensor, which is arranged within the battery cell housing at a location different from the location of the stack. The communication device may be designed, for example, as a wireless transmission device, which transmits and/or receives data, for example, over Bluetooth or WLAN, but also, for example, by means of ultrasound or light waves.

One design of the invention specifies that the stack comprising the two carriers is connected mechanically with an outer side of a wall of the battery cell housing. The stack is thus arranged at an outer wall of the housing and attached there. Thus, the electronic system is especially easily accessible, for example for assembly purposes.

In an enhancement of the invention, the stack comprising the two carriers is arranged on the outer side of the housing between the two electrical connection terminals of the battery cell housing. As previously explained, the housing normally has two exposed connection terminals or poles. A space between the poles is beneficially utilized by means of a stack arranged between the poles, particularly fitting flush with the poles.

Alternatively, it may be provided that the stack comprising the two carriers is mechanically and/or thermally connected to an inner side of a wall of the battery cell housing. With a cuboid battery cell housing, for example, and a galvanic cell arranged therein, for example, there are typically cavities between the galvanic cell and the battery cell housing. Said cavities can be beneficially utilized for accommodating the stack. In order to securely arrange the stack within the battery cell housing, the stack is attached to the inner wall of the battery cell housing. With a battery cell housing produced from a thermally conductive material, e.g., aluminum, waste heat, which normally is produced due to the microelectronic circuits during operation, can be discharged to the battery cell housing and finally to the environment outside of the battery cell housing. Thus, the stack can be cooled in an advantageous manner.

In addition, the invention also relates to a battery having a series circuit and/or parallel circuit of at least two battery cells according to the invention.

A motor vehicle according to the invention comprises at least one battery according to the invention. The motor vehicle may be designed, for example, as a passenger car, particularly as an electric or hybrid motor vehicle. The motor vehicle may also be designed, however, as an electrically driven motorcycle or bicycle.

However, it is also possible to provide the battery in a stationary energy storage system. In doing so, it may be provided, for example, that the battery, which was used in a motor vehicle, is reused as a so-called second-life battery in the stationary energy storage system.

The embodiments preferably presented with reference to the battery cell according to the invention and the advantages thereof apply accordingly to the battery according to the invention as well as to the motor vehicle according to the invention.

The invention will now be explained in greater detail in the following by means of a preferred exemplary embodiment as well as with reference to the enclosed drawings.

BRIEF DESCRIPTION OF THE DRAWINGS

The following is shown.

The same and functionally equivalent elements have the same reference numbers in the figures.

The exemplary embodiment explained in the following refers to preferred embodiments of the invention. With the exemplary embodiments however, the described components of the embodiments represent individual features of the invention that are to be considered independently from one another, each of which also further develop the invention independently of one another, and thus also are to be considered individually or in a combination that is different than the one shown as a component of the invention. Furthermore, the described embodiments can also be supplemented through other already described features of the invention.

DETAILED DESCRIPTION OF THE DRAWINGS

Figure 1:
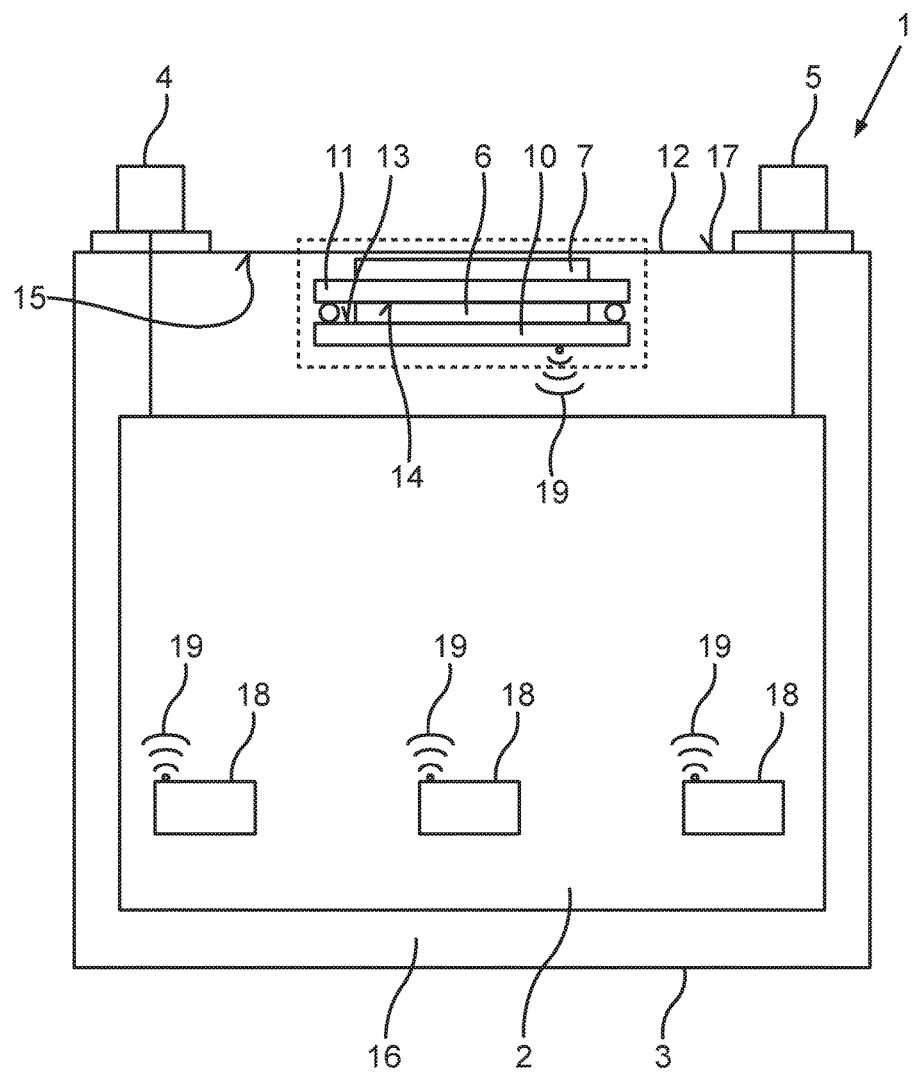
FIG. 1 shows a schematic representation of an embodiment of a battery cell, in which microelectronic circuits are arranged on various carriers.

FIG. 1 shows a battery cell 1 with a galvanic element 2 as well as a battery cell housing 3. The galvanic element 2 here is arranged in the battery cell housing 3. The battery cell housing 3 can be produced, for example, from aluminum. The battery cell housing 3 here has two exposed or raised connection terminals 4, 5, by means of which electrical energy, for example for supplying an electrical component, can be tapped and by means of which the battery cell 1 can be provided with electrical energy for charging the battery cell 1 or by means of which the battery cell 1 can be connected to other similar battery cells to form a battery. Such a battery can be arranged, for example, in a motor vehicle, which is not shown here, for driving the motor vehicle. Such a battery may also be provided, however, in a stationary power supply system, which is not shown here.

The battery cell 1 has a first microelectronic circuit 6 and a second microelectronic circuit 7. The microelectronic circuits 6 and 7 are used to monitor the battery cell 1. The battery cell 1 equipped with the microelectronic circuits 6 and 7 is characterized as an intelligent battery cell 1.

Figure 2:
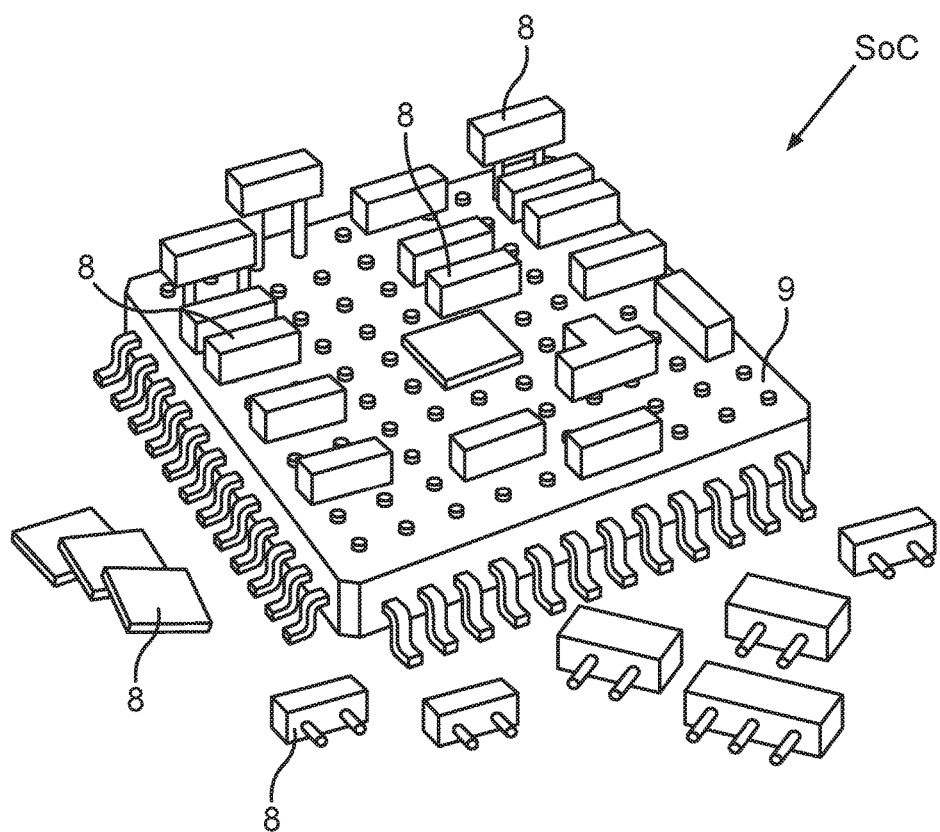
FIG. 2 shows a schematic view of a substrate populated with structural elements.

Each of the microelectronic circuits 6 and 7 here may comprise at least one so-called One-Chip-System or System-On-a-Chip (SoC), which is shown in FIG. 2. With the One-Chip-System (SoC), various elements 8 are arranged on a chip 9 or a semiconductor substrate and provide a certain functionality when connected. The elements 8 may be, for example, semiconductor structural elements, sensors, storage or memory elements, logic circuits, microprocessors, or communication devices. In doing so, multiple such One-Chip Systems (SoCs) can be connected to one another in a microelectronic circuit, for example, by means of electrical printed circuit boards.

The first microelectronic circuit 6 is arranged on a first carrier 10 and the second microelectronic circuit is arranged on a second carrier 11. The carriers 10 and 11 populated with the microelectronic circuits 6 and 7 are arranged on top of one another and form a stack 12, with which a top side 13 of the first carrier 10 is facing toward a bottom side 14 of the second carrier 11.

The stack 12 within the battery cell housing 3 is arranged in a cavity 16 here, which is formed between an inner side 15 of a wall of the battery cell housing 3 and the galvanic element 2. In addition, the stack 12 is thermally connected to the inner side 15 of the battery cell housing 3. Thus, waste heat, which is produced by the microelectronic circuits 6 and 7 during operation is discharged to the battery cell housing 3 and finally to the environment of the battery cell 1.

It is also possible to attach the stack 12 to an outer side 17 of the wall of the battery cell housing 3. In this case, it is especially advantageous to attach the stack 12 between the raised connection terminals 4 and 5, such that the space between the connection terminals 4 and 5 is optimally utilized.

Further components 18, for example temperature sensors and/or pressure sensors, which communicate with the first microelectronic circuit 6 and/or the second microelectronic circuit 7 by means of a wireless connection 19, can be provided within the battery cell housing 3. Furthermore, energy can be transmitted by means of such a wireless connection 19. To this end, for example a transformer, which is not shown here, through which energy is transmitted in the form of magnetic waves, may be provided.

In addition, the components 18 and/or the elements 8 of the microelectronic circuits 6 and 7 may be designed as so-called low-power components or as so-called ultra-low-power components. In addition, the components 18 and/or the elements 8 of the microelectronic circuits 6 and 7 may be designed as so-called nanogenerators and thus obtain energy from the environment, for example from a temperature gradient within the battery cell housing 3.

Figure 3:
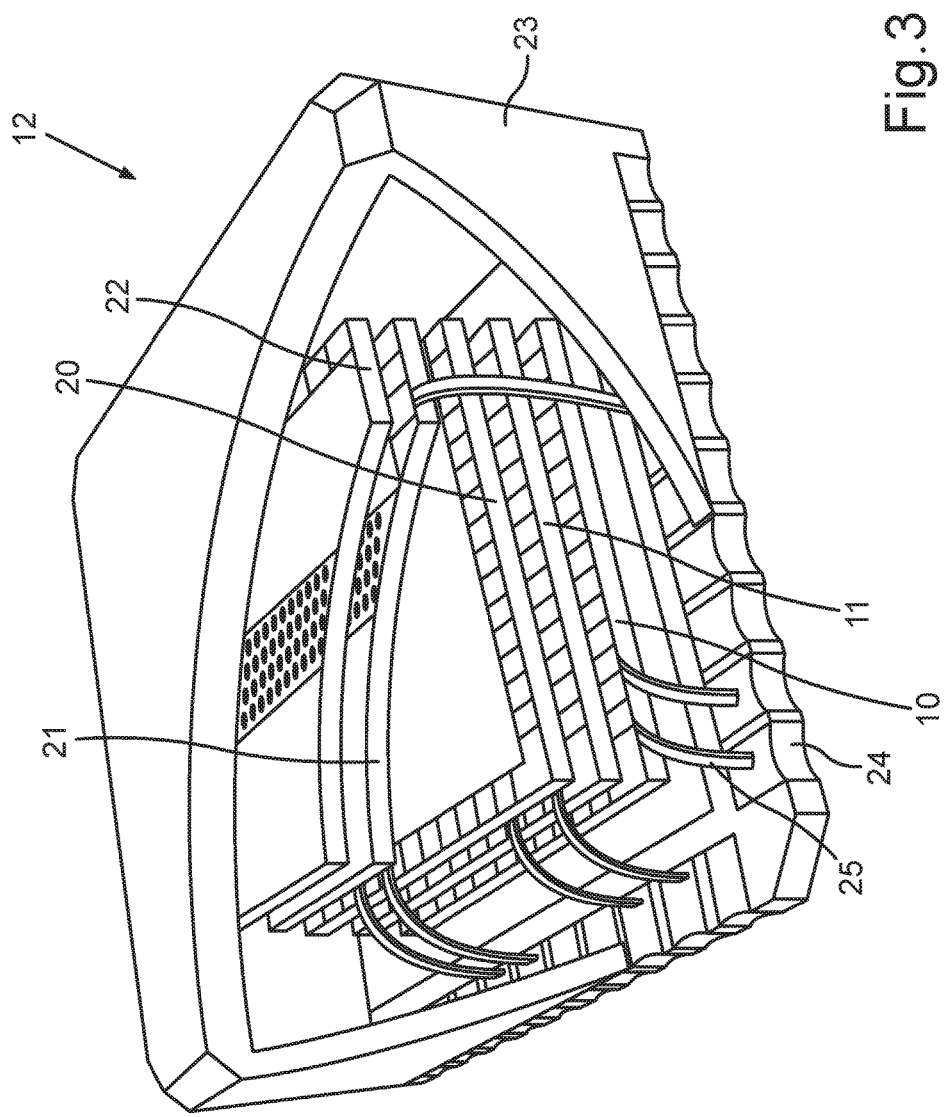
FIG. 3 shows a schematic representation of a stack, which has microelectronic circuits.

FIG. 3 shows a schematic representation of the stack 12. In this case, the first carrier 10, the second carrier 11, a third carrier 20, a fourth carrier 21, and a fifth carrier 22 are stacked on top of one another. The carriers 10, 11, 20, 21, 22 each have a microelectronic circuit and are arranged in a common housing 23, which is shown here opened up in sections. The common housing 23 has multiple electrical contact surfaces 24, which are electrically connected to the carriers 10, 11, 20, 21, 22, particularly the microelectronic circuits thereof, by means of bond connections 25. The stack 12, in which the carriers 10, 11, 20, 21, 22 are arranged with their microelectronic circuits in the common housing 23, is also characterized as a System-in-Package (SiP).

Figure 4:
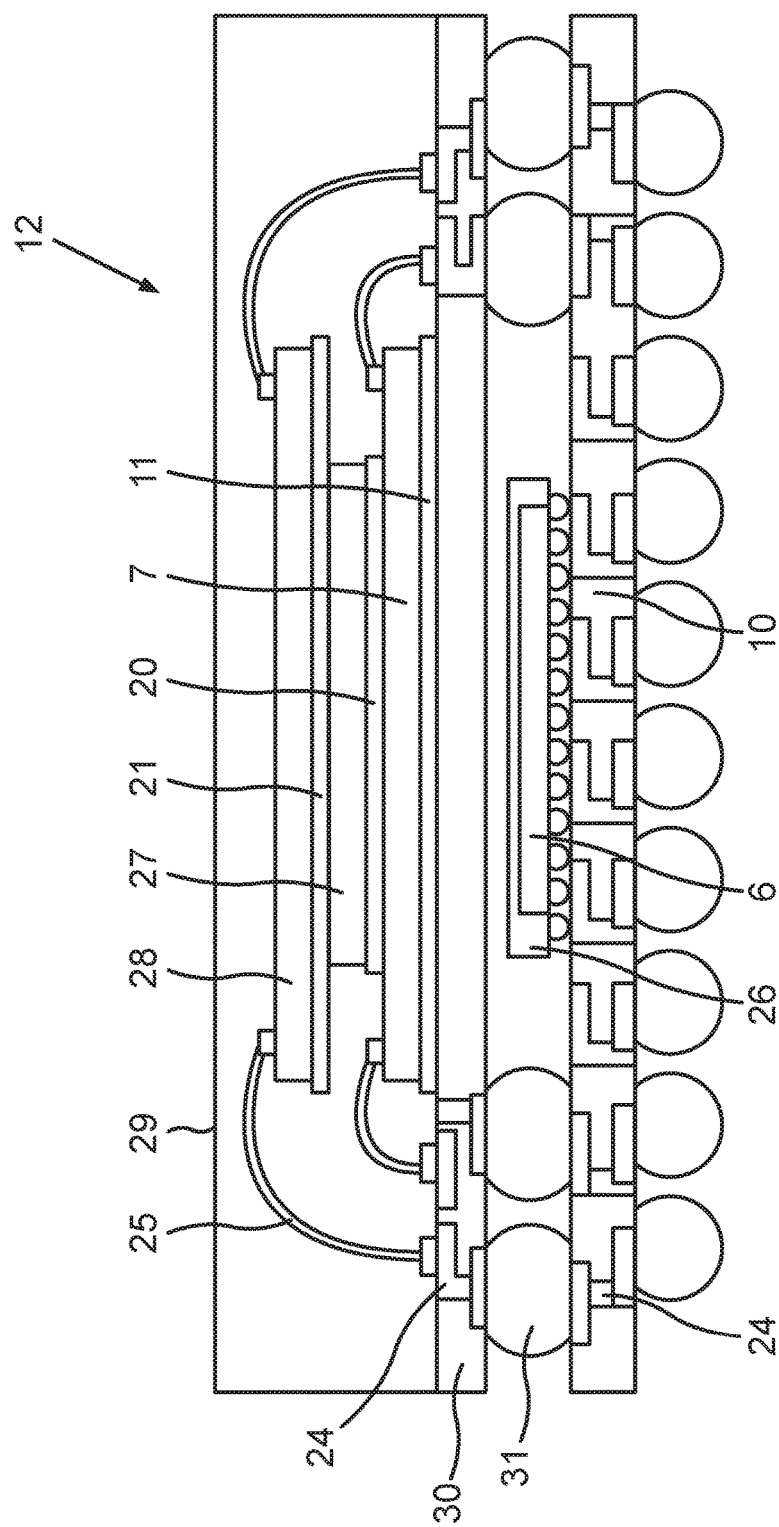
FIG. 4 shows a schematic representation of another stack, which has microelectronic circuits.

FIG. 4 shows another stack 12 in a sectional view. Here, the first microelectronic circuit 6 is arranged in a first housing 26. The first housing 26 is arranged on the first carrier 10. The first housing 26 with the first microelectronic circuit 6 and the first carrier 10 form a so-called first package. The second carrier 11 with the second microelectronic circuit 7, the third carrier 20 with a third microelectronic circuit 27, and the fourth carrier 21 with a fourth microelectronic circuit 28 are arranged in a second housing 29 and thus form a second package. The microelectronic circuits 7, 27, 28 are electrically connected to electrical contact surfaces 24 of a housing base 30 of the second housing 29 by means of soldered connections. The second package here is designed as a System-in-Package (SiP), as is shown, for example, in FIG. 3.

The first and the second packages are mechanically and electrically connected to one another in that the electrical contact surfaces 24 of the housing base 30 are connected to electrical contact surfaces 24 of the first carrier 10 by means of an electrically conductive connection element 31, for example a soldered connection. The packages, which are stacked on top of one another and contacted with one another, form a so-called package-on-package.

The first, lower package here is characterized as the bottom package. The bottom package may comprise, for example, a logic circuit as the first microelectronic circuit 6. The second package, which is placed on and making contact with the bottom package, is characterized as the top package. The top package may comprise, for example, a storage or memory element or a storage or memory module. The package-on-package may also comprise more than two packages.

The stacking of the packages provides the advantage that the individual microelectronic circuits 6, 7, 27, 28 can be tested separately. If, for example, an SoC chip of one of the microelectronic circuits 6, 7, 27, 28 is defective, said defective SoC chip or the package with the defective SoC chip can be replaced in a simple manner. Furthermore, a determination of a certain chip combination or a certain package combination is possible up until shortly before the contacting of the individual packages, that is, until shortly before the soldering process. Thus, with a package-on-package for example, the storage size of the chip lying above, that is the upper package, which comprises the storage or memory module, can be varied before the soldering process. A further advantage of the stack 12 according to FIG. 4 exists in the short contacting path between the two packages. Thus, the storage or memory element and the connection between the two chips, for example, can be operated with high cycle frequencies.

Because the stacks 12, as they are shown in FIGS. 3 and 4, are arranged within the battery cell housing 3, the housings 23, 26, 29 are preferably produced from a corrosion-resistant material, which is not damaged or destroyed due to the electrolyte of the galvanic element 2.

The invention claimed is:

1. A battery cell for a battery of a motor vehicle comprising:
a galvanic element, a battery cell housing for accommodating the galvanic element, and at least two microelectronic circuits for monitoring the battery cell, wherein a first microelectronic circuit of the at least two microelectronic circuits is attached to a first carrier and a second microelectronic circuit of the at least two microelectronic circuits is attached to a second carrier, wherein the two carriers are arranged on top of one another and thus form a stack such that a top side of the first carrier is facing toward a bottom side of the second carrier.

2. The battery cell according to claim 1, wherein the first microelectronic circuit is arranged in a first housing and the second microelectronic circuit is arranged in a second housing, and the two carriers are mechanically and electrically coupled to one another.

3. The battery cell according to claim 1, wherein the first carrier with the first microelectronic circuit and the second carrier with the second microelectronic circuit are arranged together in one housing, and the two carriers are mechanically and electrically coupled to one another.

4. The battery cell according to claim 2, wherein the housing or housings is or are produced from a material that is not sensitive to an electrolyte of the galvanic element, particularly to a ceramic material.

5. The battery cell according to claim 1, wherein the first microelectronic circuit and the second microelectronic circuit have at least one of the following components: at least one storage or memory module, at least one sensor element, at least one communication device, at least one microprocessor.

6. The battery cell according to claim 1, wherein the stack comprising the two carriers is mechanically connected to an outer side of a wall of the battery cell housing.

7. The battery cell according to claim 6, wherein the stack comprising the two carriers is arranged on the outer side of the battery cell housing between two electrical connection terminals of the battery cell housing.

8. The battery cell according to claim 1, wherein the stack comprising the two carriers is mechanically and thermally connected to an inner side of a wall of the battery cell housing.

* * * * *